United States Patent
Camuffo et al.

(10) Patent No.: US 9,413,299 B2
(45) Date of Patent: *Aug. 9, 2016

(54) SYSTEMS AND METHODS UTILIZING ADAPTIVE ENVELOPE TRACKING

(71) Applicant: Intel Deutschland GmbH, Neubiberg (DE)

(72) Inventors: Andrea Camuffo, Munich (DE); Alexander Belitzer, Munich (DE); Bernhard Sogl, Unterhaching (DE)

(73) Assignee: Intel Deutschland GmbH, Neubiberg (DE)

(*) Notice: Subject to any disclaimer, the term of this patent is extended or adjusted under 35 U.S.C. 154(b) by 0 days.

This patent is subject to a terminal disclaimer.

(21) Appl. No.: 14/842,104

(22) Filed: Sep. 1, 2015

(65) Prior Publication Data

US 2015/0372647 A1 Dec. 24, 2015

Related U.S. Application Data

(63) Continuation of application No. 13/945,096, filed on Jul. 18, 2013, now Pat. No. 9,166,830.

(51) Int. Cl.
| | |
|---|---|
| *H03F 1/02* | (2006.01) |
| *H04L 25/03* | (2006.01) |
| *H04L 27/02* | (2006.01) |
| *H03F 1/32* | (2006.01) |
| *H03F 3/21* | (2006.01) |
| *H03G 3/30* | (2006.01) |
| *H04L 27/04* | (2006.01) |

(52) U.S. Cl.
CPC .............. *H03F 1/0233* (2013.01); *H03F 1/02* (2013.01); *H03F 1/0227* (2013.01); *H03F 1/3247* (2013.01); *H03F 3/21* (2013.01); *H03G 3/30* (2013.01); *H04L 25/03* (2013.01); *H04L 27/02* (2013.01); *H04L 27/04* (2013.01); *H03F 2200/102* (2013.01); *H03F 2200/129* (2013.01); *H04L 25/03343* (2013.01)

(58) Field of Classification Search
CPC ....... H03F 1/02; H03F 1/0227; H03F 1/3247; H03F 2200/102; H04L 25/03343; H04W 88/02

See application file for complete search history.

(56) References Cited

U.S. PATENT DOCUMENTS

| | | | |
|---|---|---|---|
| 6,725,021 | B1 | 4/2004 | Anderson et al. |
| 7,190,150 | B2 | 3/2007 | Chen et al. |
| 9,066,368 | B2 * | 6/2015 | Lorenz ................. H04W 88/02 |
| 2013/0027129 | A1 | 1/2013 | Langer |
| 2013/0034139 | A1 * | 2/2013 | Khlat .................... H03F 1/0227 375/224 |
| 2013/0231069 | A1 | 9/2013 | Drogi |
| 2014/0179250 | A1 | 6/2014 | Shute |

OTHER PUBLICATIONS

Non-Final Office Action Dated Nov. 20, 2014 U.S. Appl. No. 13/945,096.
Notice of Allowance Dated Jun. 22, 2015 U.S. Appl. No. 13/945,096.

* cited by examiner

*Primary Examiner* — Thanh Le
(74) *Attorney, Agent, or Firm* — Eschweiler & Associates, LLC

(57) ABSTRACT

A communication system utilizing adaptive envelope tracking includes a transmit path, a feedback receiver, a parameter component and an envelope tracking component. The transmit path is configured to generate a transmit signal. The feedback receiver is configured to generate a feedback signal from the transmit signal. The parameter component is configured to generate linearity parameters from the feedback signal and the baseband signal. The envelope tracking component is configured to generate a supply control signal having time delay adjustments.

20 Claims, 4 Drawing Sheets

SYSTEMS AND METHODS UTILIZING ADAPTIVE ENVELOPE TRACKING

CROSS REFERENCE TO RELATED APPLICATIONS

This application is a continuation of U.S. application Ser. No. 13/945,096 filed on Jul. 18, 2013, and is hereby incorporated in its entirety.

BACKGROUND

Communication systems utilize power amplifiers to boost signals for prior to transmitting, such as transmitting via an antenna. Two important characteristics for amplifiers used in such systems are gain and power efficiency.

The gain of an amplifier is the measure of the ability of an amplifier to increase an output signal from an input signal. It is important that the gain be at the right value. Additionally, it is important that the gain be relatively constant for varied input values and frequencies. Variations in gain can lead to distorted signals upon transmission. Thus, a relatively constant gain, without variations according to input signal values, is needed.

The power efficiency is the ratio of output power to input power. Some amplifiers may only be efficient when the input signal has a high value. In others, the efficiency may depend on frequency.

A challenge faced by amplifier designers is to provide constant gain while also having high power efficiency. Often, improving gain comes at the expense of power efficiency and improving power efficiency comes at the expense of not having a constant gain.

DETAILED DESCRIPTION

Figure 1:
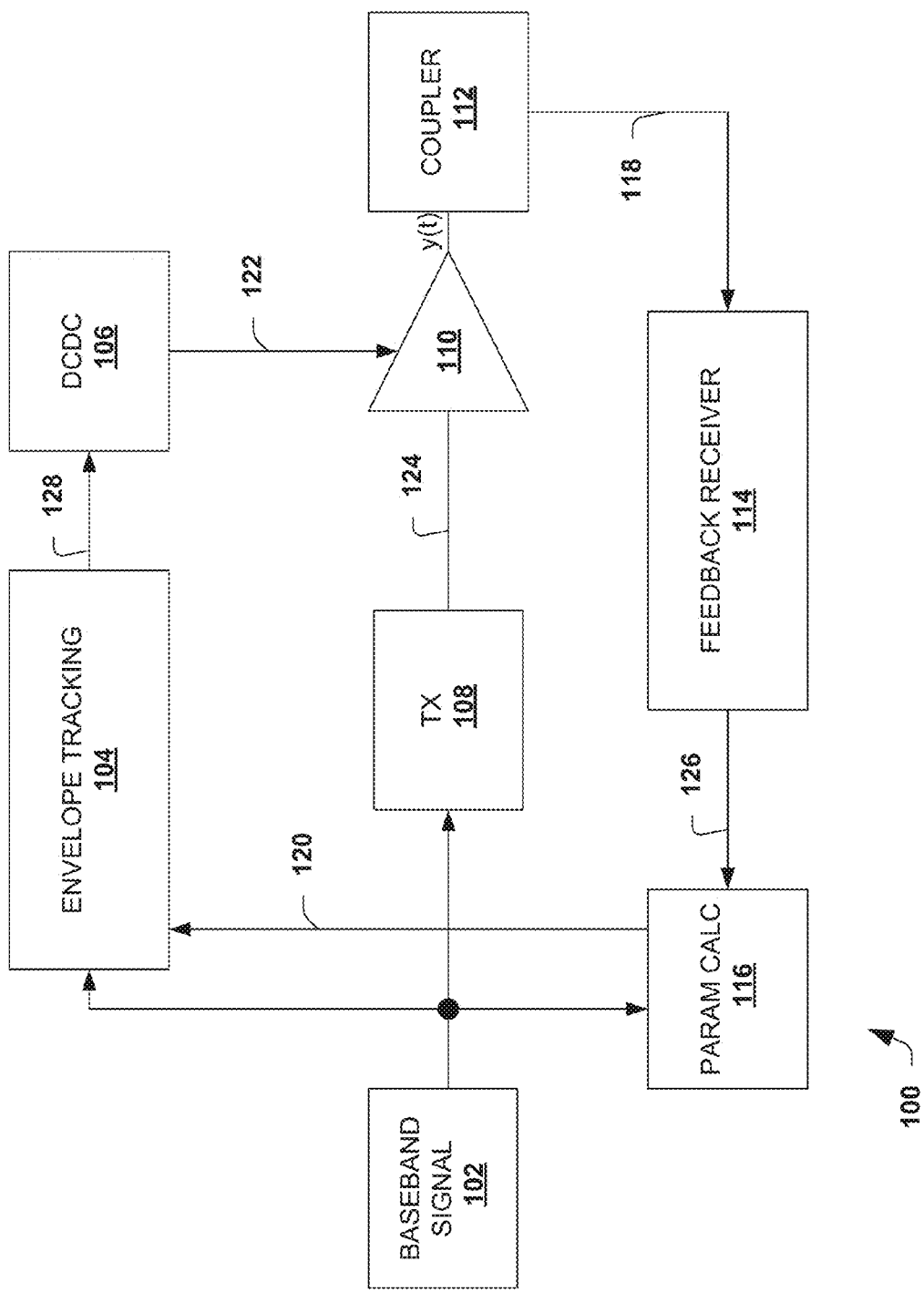
FIG. 1 is a block diagram illustrating a communication system utilizing envelope tracking with time delay tracking.

The present invention will now be described with reference to the attached drawing figures, wherein like reference numerals are used to refer to like elements throughout, and wherein the illustrated structures and devices are not necessarily drawn to scale.

Systems and methods are disclosed that utilize adaptive envelope tracking, including time domain tracking. They include measuring/tracking one or more parameters of a replica transmit signal to further configure a DCDC supply signal for a power amplifier. The system measures a parameter, such as adjacent linearity, channel leakage ratio (ACLR), error vector magnitude (EVM) degradation, amplitude modulation to amplitude modulation (AMAM) curves, amplitude modulation to phase modulation (AMPM) curves, memory behavior and time variant distortion, and the like. These measured parameters are utilized to adapt the envelope tracking, including time alignment, accordingly.

Generally, envelope tracking (ET) is a technique where a power amplifier is supplied through a fast DCDC converter, which has an output voltage varying over time as a function of amplitude modulation. The power amplifier is operated as closes as possible to saturation during the modulation peaks and to lower voltages when the instantaneous amplitude signal is low. As a result, power amplifier efficiency is increased.

There are some challenges to envelope tracking. The gain of the power amplifier is affected by the DCDC voltage. Thus, simply following peaks of an amplitude modulation signal lead to gain variations, which result in distortion. Furthermore, amplitude modulation phase modulation (AM/PM) phenomena may take place, which impairs modulation quality resulting in spurious emissions (unwanted energy in neighboring channels) or error vector magnitude (EVM) degradation.

It is noted that time alignment between the DCDC voltage and an envelope of a signal in the RF path is important. This time alignment is also referred to as synchronization. Any drift of synchronization during operation causes unwanted signal distortion. This unwanted signal distortion is not detectable in conventional systems.

One technique to mitigate distortion to modulation signals is to select a trajectory of a DCDC control voltage accurately so that the gain stays constant. It is noted that as a signal level increases and an amplifier approaches saturation, its instantaneous gain diminishes. As stated above, the DCDC voltage is increased when the amplitude modulation signal goes through a peak, however increasing the DCDC voltage generally leads to a gain increase. By combining these two effects, a cancellation can be obtained, thus limiting unwanted distortion of the signal. For this technique to work, AM/PM introduced by the power amplifier must be negligible.

Another technique is to compensate AM/AM and AM/PM distortions by adequately predistorting a supply input to the power amplifier. This technique can utilize closed loop and open loop architectures. Closed loop architectures need an extremely wide bandwidth in order to not create excess noise at duplexer offset and, may not be feasible. Open loop architectures need to know characteristics of a power amplifier.

One approach to obtaining the power amplifier characteristics is to utilize iso gain contours and knowledge of AM/AM and AM/PM curves as a function of instantaneous DCDC voltage.

However, calibrating isogain contours is problematic. The prolong calibration time for power amplifier calibration time, for example at the factory. The isogain contours must be stored in a memory. Further, the isogain contours are fixed for certain characteristics of the power amplifier. If those characteristics change, the isogain contours may not apply or match the current characteristics of the power amplifier.

FIG. 1 is a block diagram illustrating a communication system 100 utilizing envelope tracking with time delay tracking. The system 100 learns and/or updates linearity parameters utilizing a feedback receiver 114 to mitigate amplifier gain variations and power consumption. The system 100 utilizes, for example, isogain contours and predistortion coefficients, and the like to modify DC supply to the power amplifier. Unlike the other techniques described above, the envelope tracking of the system 100 is adaptive, thus it adjusts over time.

The system 100 includes a baseband signal component 102, a transmit component 108, a power amplifier 110, a coupler 112, an envelope tracking component 104, a DCDC converter 106, a feedback receiver 114, and a parameter calculation component 116.

The baseband signal component 102 provides a baseband signal, x(t), at its output. The baseband signal is received by the transmit component 108. The transmit component 108 can include a digital and/or analog transmit chain. The transmit component 108 generates a modulation signal 124 from the baseband signal and provides the modulation signal 124 to the power amplifier 110.

The power amplifier 110 generates a transmit signal, y(t), from the modulation signal 124. The power amplifier 110 is supplied by a DCDC supply signal 122, which varies according to envelope tracking. The DCDC supply signal 122 is calibrated as described below to include envelope tracking, including time delay tracking or time synchronization.

The transmit signal, y(t), generally has some amount of distortion present. The distortion is due to amplitude modulation to phase modulation phenomena, amplitude modulation to amplitude modulation phenomena, non-linearity or saturation of the amplifier 110, inaccurate time alignment, and the like.

The coupler 112 generates a coupled transmit signal 118 from the transmit signal, y(t). The transmit signal y(t) is provided by the power amplifier 110. The coupled transmit signal 118 is an attenuated replica of the transmit signal. The transmit signal passes through the coupler and can be transmitted via an antenna and/or other suitable mechanism (not shown).

The feedback receiver 114 demodulates and analyzes the transmit signal in baseband. A feedback signal 126 is generated, also at the baseband. In one example, the feedback signal 126 includes real and imaginary components Real(y) and Imag(y).

The parameter calculation component 116 receives the feedback signal 126 and the baseband signal 102 and develops a parameter signal 120. Generally, the parameter calculation component 116 learns and/or updates linearity parameters for envelope tracking. The parameters are learned/updated by comparing the baseband signal 102 and the feedback signal 126 and indicate linearity of the transmit signal. These parameters are then utilized to generate the parameter signal 120.

The parameter calculation component 116 is configured to measure and/or identify the linearity parameters. These can include indicators of linearity, including adjacent linearity, channel leakage ratio (ACLR), error vector magnitude (EVM) degradation, amplitude modulation to amplitude modulation (AMAM) curves, amplitude modulation to phase modulation (AMPM) curves, memory behavior and time variant distortion, and the like. The component 116 generates the parameter signal 120 having the measured and/or identified parameters. The parameter signal 120, in one example, can include coefficients related to time delay, time delays, and the like. In another example, the parameters signal 120 only includes measured linearity parameters for a current time period. The parameter signal 120 facilitates alignment of the DCDC signal 122 with an RF envelope of the transmit signal.

Generally, the envelope tracking component 104 maps an amplitude of the baseband signal 102 to the DCDC supply signal 122. The envelope tracking component 104 provides a control signal 128 to the DCDC supply 106, where the control signal 128 includes time delay adjustment(s). The envelope tracking component 104 generates the control signal 128 according to the baseband signal 102 and the parameter signal 120. The baseband signal 102 facilitates mapping to the amplitude of the baseband signal 102 and the parameter signal 120 facilitates further adjustments based on measured parameters, which are described in further detail below. The control signal 128 facilitates alignment of the DCDC signal 122 with the RF envelope of the transmit signal.

In one example, the envelope tracking component 104 utilizes a lookup table to generate the control signal 128. The one or more parameters are utilized to look up a time delay adjustment, which is incorporated into the control signal 128. The lookup table may include coefficients and the like. In another example, coefficients are learned and updated for each time slot or time period.

In another example, time delay adjustments are made using slow learning without storing coefficients. In this example, initial time slots start with high DCDC voltage and low envelope tracking depth, which yields limited power efficiency but high gain. During each slot, the linearity parameters of the signal 120 are observed and the proximity to saturation is estimated. Then, the time delay adjustment component of the signal 128 is adjusted accordingly.

In yet another example, the envelope tracking component 104 determines time delay adjustments. An initial or nominal time delay is identified by calibration, and takes into account linearity and energy consumption. The linearity parameters are compared with a threshold value. On the parameter exceeding a threshold, the time delay adjustment is altered in direction and/or amount. By exceeding the threshold, the parameter and the transmit signal has degraded beyond a limit.

The direction of the change in the adjustment 120 can be determined by analyzing system characteristics and/or investigating parameter trend progression over time. The characteristics include one or more of temperature, antenna impedance, and the like. Such characteristics can be provided from sensors and the like (not shown). Otherwise, the direction is determined by whether the adjustment 120 improves or degrades the parameter(s). If the adjustment worsens the parameter, it can be assumed that the direction is incorrect.

The DCDC component 106 generates the DCDC supply signal 122 according to the control signal 128. The DCDC supply signal 122 generally tracks the envelope of the transmit signal. The DCDC supply signal 122 tracks or follows an amplitude modulation component of the transmit signal so that the gain of the power amplifier 110 is relatively constant.

Thus, the system 100 adaptively adjusts the DCDC supply signal for the power amplifier 110 to mitigate linearity variations and power consumption. Further, by adapting over time, the system 100 adapts to varied operating system characteristics, including environmental conditions and the like.

Figure 2:
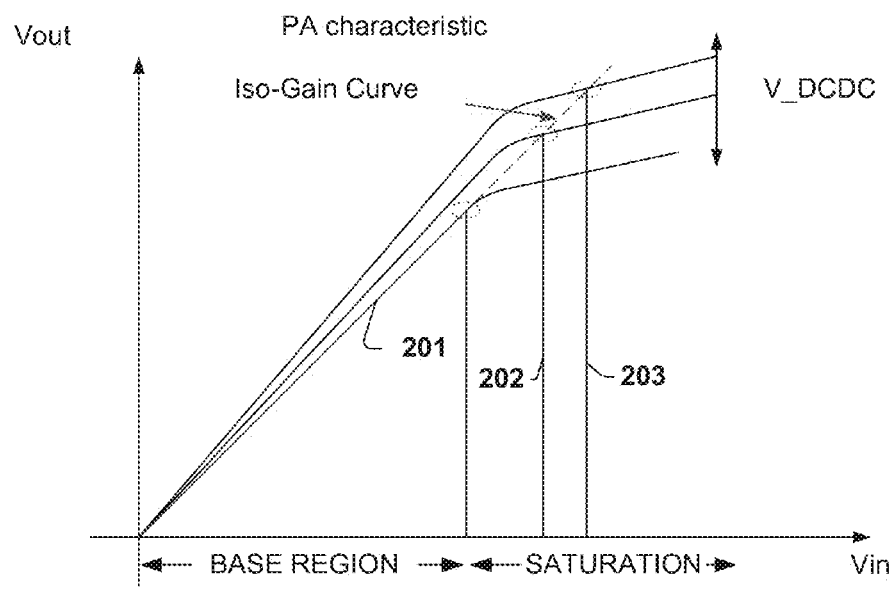
FIG. 2 is a graph illustrating isogain curves and adjustments for a power amplifier.

FIG. 2 is a graph 200 illustrating isogain curves and adjustments for a power amplifier. The graph 200 is provided for illustrative purposes. The power amplifier can include the power amplifier 110, described above.

An isogain curve represents behavior of a power amplifier supplied by a constant voltage. Generally, a power amplifier has a linear region/range and a saturation region/range. In the linear region, the output power has a linear relationship to the input power. In the saturation region, the output power has a non-linear relationship to the input power. An envelope tracking component, such as component 104 described above, causes the DCDC supply to the power amplifier to be compensated or predistorted in order to provide a substantially linear gain.

The graph 200 includes an input voltage on an x-axis and an output voltage on a y-axis. Curve 201 shows an example. In a base or linear region, the output voltage is linear with respect to the input voltage. However, in a saturation region, a non-linear relationship is shown. At this point, the input voltage has reached a saturation point. And, as a result, the output voltage doesn't follow properly.

As described above, an adjustment or compensation is made in order to provide a linear output voltage. In the system 100, described above, the control signal causes the output voltage to increase. For example, at the input voltage 202, the curve 201 would yield a non-linear output voltage and, as a consequence, a non-constant gain in the saturation region. The adjustment is made to alter or shift to a different curve such that the output voltage for the input 202 follows linearly from the linear region portion of the curve 201. Similarly, at the input voltage 203, the curve 201 would again yield a non-linear output voltage and a non-constant gain. The adjustment is again made to another varied curve so that the output voltage for the input 203 follows linearly from the linear region portion of the curve 201.

Figure 3:
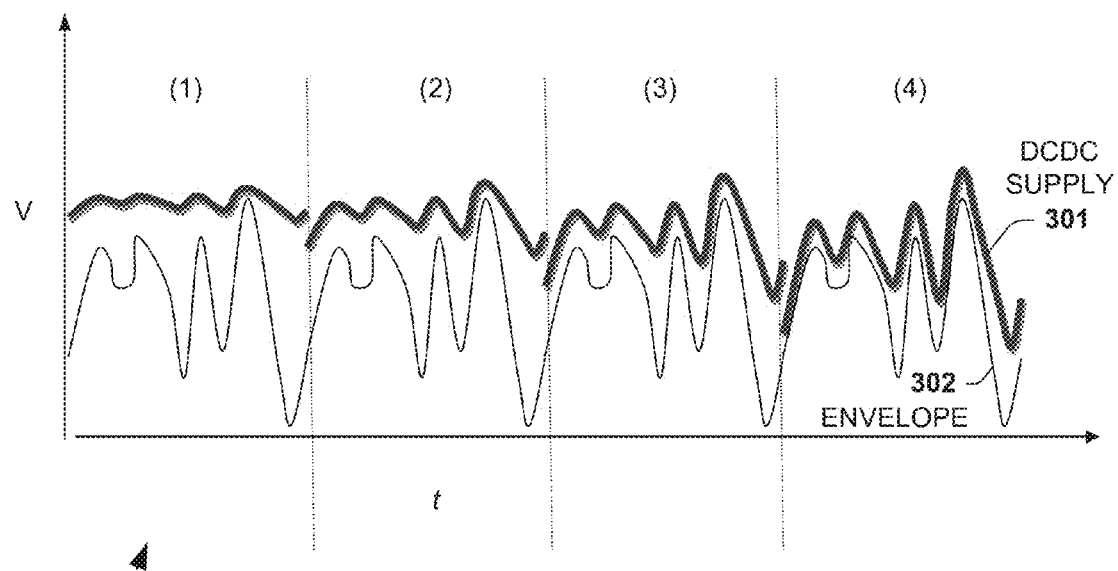
FIG. 3 is a graph illustrating an example of adaptive, iterative envelope tracking through a series of time periods.

FIG. 3 is a graph 300 illustrating an example of adaptive, iterative envelope tracking through a series of time periods. The graph 300 is provided as an example to illustrate adaptively adjusting a DCDC supply to a power amplifier, such as the amplifier 110 described above.

The graph 300 depicts time on an x-axis and voltage on a y-axis. The graph 300 includes a DCDC supply waveform 301 and an RF envelope 302 of a transmit signal, such as the signal generated via system 100. The graph 300 shows 4 consecutive time periods, labeled (1) to (4).

In a first time period (1), the DCDC supply 301 somewhat tracks the envelope 302. However, it can be seen that there is substantial misalignment, which could be due to non-linearity or saturation. In a second time period (2), the system 100 has incorporated some adjustments. As a result, the DCDC supply more closely tracks the envelope 302 in (2). In a third time period (3), the DCDC supply tracks the envelope 302. In a fourth time period (4), the DCDC supply 301 closely tracks the envelope 302.

Figure 4:
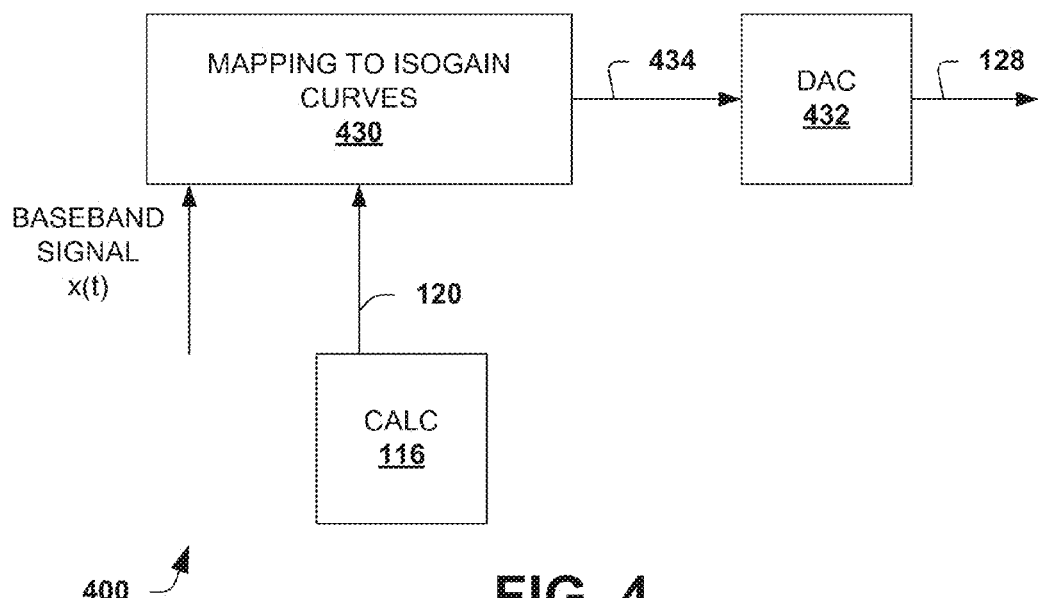
FIG. 4 is a block diagram illustrating an envelope tracking component using isogain curves mapping in a communication system.

FIG. 4 is a block diagram illustrating an envelope tracking component 400 using isogain curves mapping in a communication system. The component 400 receives a baseband signal and a parameter signal 120 and generates a control signal 128 for a DCDC supply component.

The component 400 can be utilized as the envelope tracking component 104, shown above. The component 400 includes a mapping component 430 and a digital to analog converter 432. The mapping component 430 receives the parameter signal 120 and the baseband signal x(t). The parameter signal 120 is based on or includes an envelope of a transmit signal.

The mapping component 430 stores or has access to a plurality of isogain curves, such as the curves shown in FIG. 2. The mapping component 430 maps the parameter signal 120 and the baseband signal to one of the isogain curves. The mapping component 430 can determine whether the envelope is within the linear region or the saturation region. Once mapped, the component 430 generates a digital DCDC control adjustment 434.

The digital to analog component 432 converts the digital adjustment 434 into the control signal 128. The signal 128 is provided to a DCDC supply, such as the supply component 106 described above, which supplies an instantaneous DCDC supply to a power amplifier.

Figure 5:
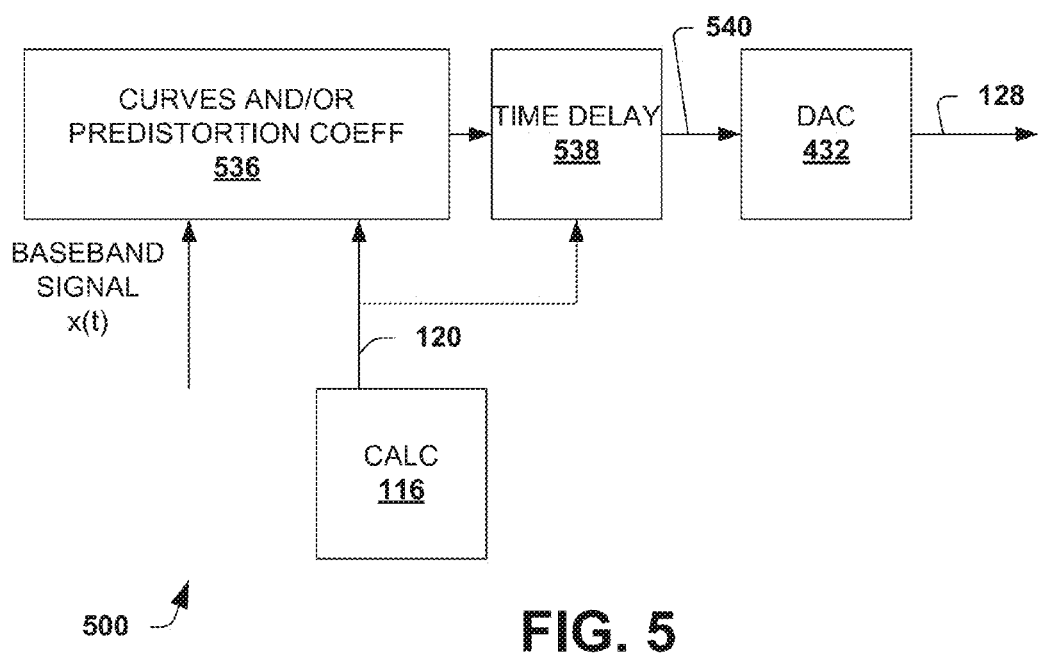
FIG. 5 is a block diagram illustrating an envelope tracking component using isogain curves and/or predistoriton coefficients in a communication system.

FIG. 5 is a block diagram illustrating an envelope tracking component 500 using isogain curves and/or predistoriton coefficients in a communication system. The component 500 receives a baseband signal and an parameter signal 120 and generates a control signal 128 for a DCDC supply component.

The component 500 includes a curves and/or predistortion coefficient component 536, a time delay component 538, and a digital to analog converter 432. The component 536 receives the parameter signal 120 and the baseband signal. The parameter signal 120 includes linearity measurements of a transmit signal.

The component 536 determines whether an adjustment is needed based on the parameter signal 120. If an adjustment is needed, a digital control adjustment is generated and provided to the time delay component 538.

The time delay component 538 receives the digital control adjustment and the parameter signal 120 and is configured to incorporate a time synchronization adjustment into the digital control signal 540. The digital control signal 540 is converted into an analog control signal 128 by the digital to analog converter 432. The analog control signal 128 can then be provided to a DCDC supply component, such as the DCDC supply component 106 described above, which supplies an instantaneous DCDC supply to a power amplifier.

Figure 6:
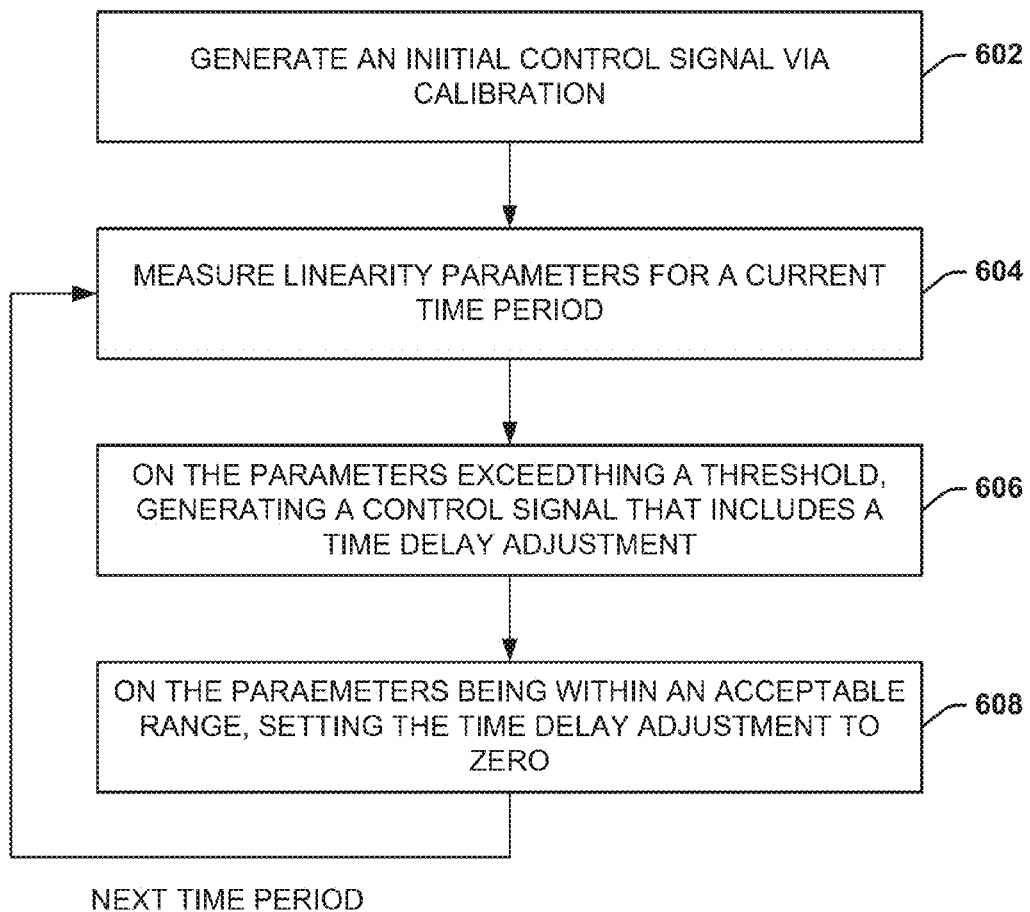
FIG. 6 is a flow diagram illustrating a method of performing adaptive envelope tracking with time delay tracking.

FIG. 6 is a flow diagram illustrating a method 600 of performing adaptive envelope tracking with time delay tracking. The method 600 can be performed at least in part using one or more of the above described systems.

The method 600 begins at block 602, where an initial supply control signal is generated by calibration. The initial supply control signal is a signal that can be supplied to a DCDC supply component, such as those described above. The initial supply control signal includes a nominal time delay adjustment that has been determined through calibration. The nominal time delay adjustment includes a compromise between linearity and energy consumption.

The DCDC supply component provides a supply to a power amplifier, which amplifies a modulated signal from a transmit path. The transmit path generates the modulated signal from a baseband signal.

Linearity parameter(s) or measurements are obtained from a feedback signal during a time period or slot at block 604. The feedback signal is generated by a feedback receiver and represents characteristics of the transmit signal. The linearity parameters are generated by comparing the feedback signal with a baseband signal. Thus, the linearity parameters represent measurements of linearity of the transmit signal. The parameters include, for example, ACLR, EVM, and the like.

On the parameters exceeding a threshold, a control signal is generated at block 606. The control signal includes a time delay adjustment, which includes a time delay amount and a direction of change. The time delay amount can be generated from a lookup table, coefficients, and the like. The direction of the change includes increasing or reducing. In one example, the direction is determined from the parameters. In another example, the direction is determined at least partially by other system characteristics including, but not limited to, temperature, antenna impedance, and the like. In another example, the direction is determined from trends and/or progressions of the parameters, such as EVM, based on previous time period delay adjustments.

On the parameters being within an acceptable range, further time delay adjustments in the control signal are set to zero or are no longer provided at block 608. Thus, linearity is in an acceptable range. The method can continue at block 604 for a next time slot or period.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

It is noted that the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above, are non-limiting examples of circuits that may be used to implement disclosed methods and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the disclosed subject matter.

A communication system utilizing adaptive envelope tracking includes a transmit path, a feedback receiver, a parameter component and an envelope tracking component. The transmit path is configured to generate a transmit signal. The feedback receiver is configured to generate a feedback signal from the transmit signal. The parameter component is configured to generate linearity parameters from the feedback signal. The envelope tracking component is configured to generate a supply control signal having time delay adjustments.

In one variation, the communication system further includes a coupler configured to provide a replica of the transmit signal to the feedback receiver.

In another variation, any of the systems include a DCDC supply component configured to provide a supply signal according to the supply control signal.

Any of the above communication systems can also include a power amplifier powered by the supply signal. The power amplifier is configured to amplify the transmit signal from the transmit path. The transmit signal includes time distortions.

Any of the above communications systems can also have the feedback signal having real and imaginary components.

Any of the above communication systems, where the linearity parameters include one or more of an adjacent channel leakage ratio, an error vector magnitude, amplitude modulation to amplitude modulation curves, amplitude modulation to phase modulation curves, and time variant distortion.

Any of the above communication systems where the parameter component is configured to generate linearity parameters from the baseband signal and the feedback signal.

Any of the above communications systems, where the envelope tracking component includes a time delay block configured to generate the time delay adjustments.

Any of the above communication systems, where the time delay adjustments include a time delay amount and a direction.

Any of the above communication systems, where the envelope tracking component is configured to generate an initial supply signal according to a calibration of linearity and power consumption.

Any of the above communication systems, where the envelope tracking component is configured to track the linearity parameters over successive time periods in order to generate the time delay adjustments.

Any of the above communication systems, where the envelope tracking component is configured to receive a sensor signal in order to generate the time delay adjustments.

An envelope tracking system includes a first component and a time delay component. The first component is configured to generate a control signal that tracks amplitude modulation according to a baseband signal and linearity parameters. The time delay component is configured to generate time delay adjustments for the control signal according to at least the linearity parameters.

In a variation of the envelope tracking system, the first component is configured to generate the control signal by mapping the linearity parameters and the baseband signal to isogain curves.

Any of the above envelope tracking systems, wherein the first component is configured to generate the control signal utilizing predistortion coefficients.

Any of the above envelope tracking systems, further including a parameter calculation component configured to generate the linearity parameters.

A method of performing adaptive envelope tracking with time delay tracking is disclosed. An initial supply signal including a nominal time adjustment is generated. One or more linearity parameters for a current time period from a feedback signal are obtained. A control signal having a time delay adjustment is generated on the linearity parameters exceeding a threshold value. A control signal without a time delay adjustment is generated on the linearity parameters being within an acceptable range.

The above method, wherein the linearity parameters include one or more of an error vector magnitude and an adjacent channel leakage ratio.

Any of the above methods, where the nominal time adjustment is based on a compromise between linearity and power consumption.

Any of the above methods, further including generating the feedback signal from a transmit signal prior to obtaining the one or more linearity parameters.

Although the invention has been illustrated and described with respect to one or more implementations, alterations and/or modifications may be made to the illustrated examples without departing from the spirit and scope of the appended claims. For example, although a transmission circuit/system described herein may have been illustrated as a transmitter circuit, one of ordinary skill in the art will appreciate that the invention provided herein may be applied to transceiver circuits as well. Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A communications apparatus utilizing adaptive envelope tracking, the apparatus comprising:
   first circuitry that includes a time delay component,
      wherein the first circuitry is configured to generate a modulated supply voltage that tracks an envelope of a baseband signal, and
      wherein the time delay component is configured to introduce a variable time delay between the modulated supply voltage and the envelope of the baseband signal;
   a power amplifier that receives the modulated supply voltage and that is configured to generate a transmit signal based on the baseband signal;
   second circuitry configured to generate a feedback signal based on the transmit signal; and
   third circuitry configured to measure at least one of an adjacent channel leakage ratio (ACLR) or an error vector magnitude (EVM) based at least on the feedback signal,
      wherein the third circuitry is further configured to adjust the variable time delay of the time delay component in the first circuitry based on the at least one of the ACLR or the EVM.

2. The communications apparatus defined in claim 1 wherein the third circuitry is configured to measure the at least one of the ACLR or the EVM over successive time periods and adjust the variable time delay in each of the successive time periods.

3. The communications apparatus defined in claim 1 further comprising a coupler configured to provide a replica of the transmit signal to the third circuitry.

4. The communications apparatus defined in claim 1 wherein the power amplifier is powered by the modulated supply voltage.

5. The communications apparatus defined in claim 1 wherein the feedback signal includes real and imaginary components.

6. The communications apparatus defined in claim 1 wherein the second circuitry comprises a feedback receiver.

7. The communications apparatus defined in claim 1 wherein the second circuitry is configured to eliminate absolute phase form the feedback signal.

8. The communications apparatus defined in claim 1 wherein the third circuitry is configured to adjust the variable time delay based on the feedback signal and based on the baseband signal.

9. The communications apparatus defined in claim 1 wherein the third circuitry is configured to measure the ACLR based on the feedback signal and to adjust the variable time delay based on the ACLR.

10. The communications apparatus defined in claim 1 wherein the third circuitry is configured to measure the EVM based on the feedback signal and to adjust the variable time delay based on the EVM.

11. An envelope tracking system, comprising:
   an envelope modulate configured to generate a modulated supply voltage that tracks an envelope of a baseband signal;
   a time delay component configured to introduce a variable time delay between the modulated supply voltage and the envelope of the baseband signal;
   a power amplifier that receives the modulated supply voltage and that is configured to generate a transmit signal based on the baseband signal;
   a feedback component configured to generate a feedback signal based on the transmit signal; and
   circuitry configured to adjust the variable time delay of the time delay component based on at least one of an adjacent channel leakage ratio (ACLR) or an error vector magnitude (EVM) measured via the feedback signal.

12. The envelope tracking system defined in claim 11 wherein the feedback component and the circuitry are configured to measure the at least one of the ACLR or the EVM over successive time periods and adjust the variable time delay in at least some of the successive time periods.

13. The envelope tracking system defined in claim 11 further comprising a coupler configured to provide a replica of the transmit signal to the circuitry.

14. The envelope tracking system defined in claim 11 wherein the power amplifier is powered by the modulated supply voltage.

15. The envelope tracking system defined in claim 11 wherein the feedback signal includes real and imaginary components.

16. The envelope tracking system defined in claim 11 wherein the feedback component comprises a feedback receiver.

17. The envelope tracking system defined in claim 11 wherein the feedback component is configured to eliminate absolute phase form the feedback signal.

18. The envelope tracking system defined in claim 11 wherein the circuitry is configured to adjust the variable time delay based on the feedback signal and based on the baseband signal.

19. The envelope tracking system defined in claim 11 wherein the circuitry is configured to adjust the variable time delay based on the ACLR measured via the feedback signal.

20. The envelope tracking system defined in claim 11 wherein the circuitry is configured to adjust the variable time delay based on the EVM measured via the feedback signal.

* * * * *